US009716069B2

(12) United States Patent
Takazawa et al.

(10) Patent No.: US 9,716,069 B2
(45) Date of Patent: Jul. 25, 2017

(54) SEMICONDUCTOR SUBSTRATE, IMAGE PICKUP ELEMENT, AND IMAGE PICKUP APPARATUS

(71) Applicant: OLYMPUS CORPORATION, Tokyo (JP)

(72) Inventors: Naohiro Takazawa, Tokyo (JP); Yoshiaki Takemoto, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 39 days.

(21) Appl. No.: 14/822,197

(22) Filed: Aug. 10, 2015

(65) Prior Publication Data

US 2015/0348914 A1 Dec. 3, 2015

Related U.S. Application Data

(63) Continuation of application No. PCT/JP2014/052577, filed on Feb. 4, 2014.

(30) Foreign Application Priority Data

Feb. 14, 2013 (JP) ................... 2013-027058

(51) Int. Cl.
*H01L 21/00* (2006.01)
*H01L 23/544* (2006.01)
(Continued)

(52) U.S. Cl.
CPC .......... *H01L 23/544* (2013.01); *G03F 9/7076* (2013.01); *G03F 9/7084* (2013.01);
(Continued)

(58) Field of Classification Search
CPC .................... H01L 27/14621; H01L 27/14627
See application file for complete search history.

(56) References Cited

U.S. PATENT DOCUMENTS 6,420,791 B1   7/2002 Huang et al.
7,977,141 B2 * 7/2011 Harada ............ H01L 27/14621
                                                     257/459
(Continued)

FOREIGN PATENT DOCUMENTS

EP   2001-339057 A   12/2001
JP       63-119528    5/1988
(Continued)

OTHER PUBLICATIONS

Hinnen, P. C. et al., "Advances in Process Overlay", Optomechatronic Micro/Nano Devices and Components III: Oct. 8-10, 2007, Lausanne, Switzerland; [Proceedings of SPIE, ISSN 0277-786X], SPIE, Bellingham, Wash., vol. 4344, Jan. 1, 2001, pp. 114-126, XP002512241, ISBN: 978-1-62841-730-2.
(Continued)

*Primary Examiner* — Samuel Gebremariam
(74) *Attorney, Agent, or Firm* — Westerman, Hattori, Daniels & Adrian, LLP

(57) ABSTRACT

A semiconductor substrate includes: an alignment mark being formed of a material that reflects a detection light for detecting positions and having a detection edge portion; a light-shielding layer portion having a larger outer shape than the alignment mark, being formed of a material that shields the detection light, and being disposed at a position on a backside of the alignment mark when seen from an incidence side of the detection light; and one or more light-transmitting layer portions being laminated between the alignment mark and the light-shielding layer portion so as to transmit the detection light and not being patterned at least in a range that overlaps the light-shielding layer portion.

9 Claims, 7 Drawing Sheets

(51) Int. Cl.
  *H01L 27/146* (2006.01)
  *G03F 9/00* (2006.01)
(52) U.S. Cl.
  CPC ...... *H01L 27/1464* (2013.01); *H01L 27/1469* (2013.01); *H01L 27/14623* (2013.01); *H01L 27/14634* (2013.01); *H01L 2223/54426* (2013.01); *H01L 2924/0002* (2013.01)

(56) References Cited

U.S. PATENT DOCUMENTS

| | | |
|---|---|---|
| 2008/0308890 A1 | 12/2008 | Uya |
| 2013/0092822 A1 | 4/2013 | Ichikawa et al. |

FOREIGN PATENT DOCUMENTS

| | | |
|---|---|---|
| JP | 2002-25888 A | 1/2002 |
| JP | 2003-273343 A | 9/2003 |
| JP | 2007-524991 A | 8/2007 |
| JP | 2008-311413 A | 12/2008 |
| JP | 2009-194119 A | 8/2009 |
| JP | 2011-9259 A | 1/2011 |
| JP | 2012-15276 A | 1/2012 |
| JP | 2012-094720 A | 5/2012 |
| JP | 2013-12634 A | 1/2013 |
| WO | 2004/095524 A2 | 11/2004 |

OTHER PUBLICATIONS

Notice of Reasons for Rejection dated Jul. 26, 2016, issued in counterpart Japanese Patent Application No. 2013-027058, with English translation. (11 pages).

Extended (Supplementary) European Search Report dated Aug. 19, 2016, issued in counterpart European Patent Application No. 14752038.1. (7 pages).

International Search Report dated Apr. 8, 2014, issued in counterpart Application No. PCT/JP2014/052577 (2 pages).

* cited by examiner

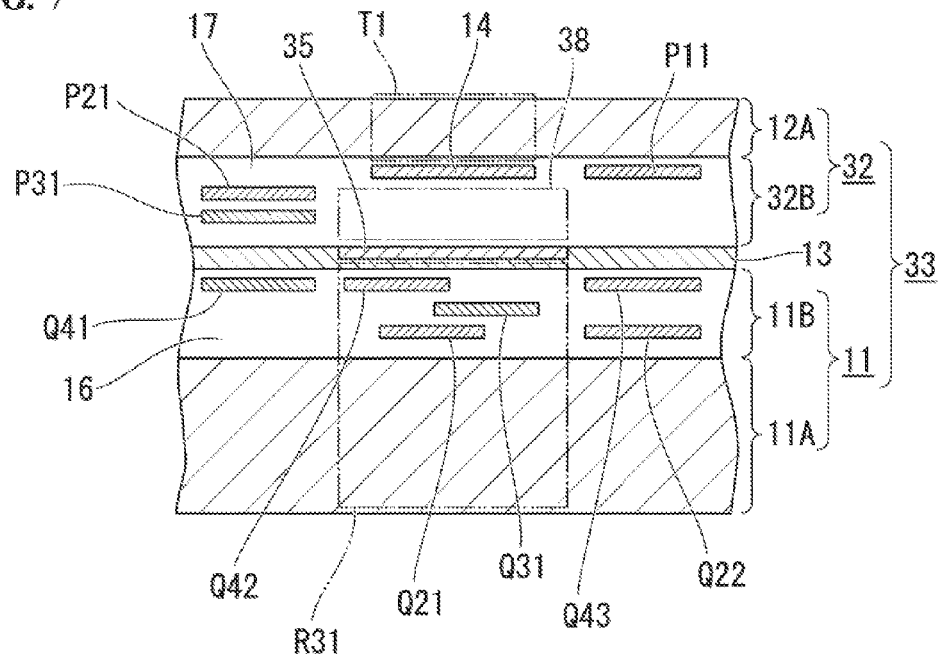
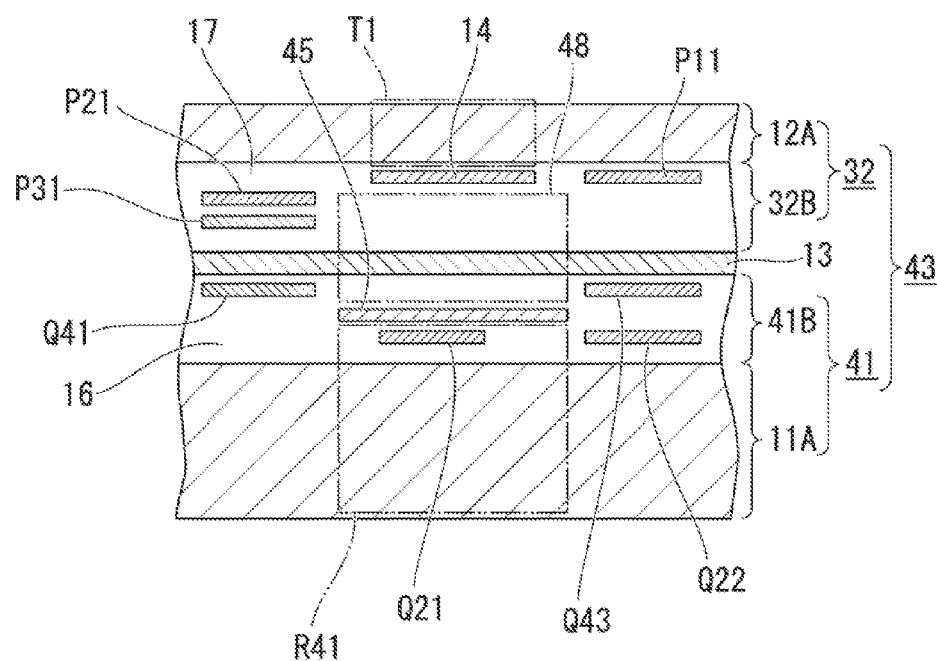

SEMICONDUCTOR SUBSTRATE, IMAGE PICKUP ELEMENT, AND IMAGE PICKUP APPARATUS

CROSS REFERENCE TO RELATED APPLICATIONS

This application is a continuation application based on a PCT Patent Application No. PCT/JP2014/052577, filed Feb. 4, 2014, whose priority is claimed on Japanese Patent Application No. 2013-027058, filed Feb. 14, 2013, the entire content of which are hereby incorporated by reference.

BACKGROUND OF THE INVENTION

Field of the Invention

The present invention relates to a semiconductor substrate, an image pickup element, and an image pickup apparatus.

Description of the Related Art

Conventionally, when an image pickup element such as, for example, a back-illuminated image sensor or a stacked image sensor is manufactured, photolithography is performed in steps of forming an on-chip color filter, an on-chip microlens, and a light-shielding film. A photomask or a reticle in which a wiring pattern is drawn is used during photolithography exposure. In this case, an alignment mark formed of a metal wire is used to realize alignment between a wafer and the mask. This alignment mark is formed in a scribe line or a chip region.

When the position of an alignment mark is detected by a semiconductor manufacturing apparatus during exposure, as disclosed in Japanese Unexamined Patent Application, First Publication No. 2011-9259, for example, a detection beam is emitted to the alignment mark and the reflection intensity thereof is measured. Thus, when a metal wire, a device, a bonding electrode, and the like, for example, are formed on an underlayer of the alignment mark, the reflection beams thereof are also detected.

As a result, when it is difficult to obtain sufficient contrast between the reflection intensity of the alignment mark and the reflection intensity of the metal wire, the device, the bonding electrode, and the like on the underlayer, the semiconductor manufacturing apparatus causes an error in recognition of the alignment mark and alignment accuracy of a wafer with the photomask or the reticle deteriorates. Moreover, the position of the metal wire or the device on the underlayer may be erroneously recognized as the position of the alignment mark, and a problem in which alignment is not realized may occur.

In order to prevent such a problem, conventionally, the metal wire, the device, and the bonding electrode are not formed on the underlayer of the alignment mark.

SUMMARY

According to a first aspect of the present invention, there is provided a semiconductor substrate including: an alignment mark being formed of a material that reflects a detection light for detecting positions and having a detection edge portion; a light-shielding layer portion having a larger outer shape than the alignment mark, being formed of a material that shields the detection light, and being disposed at a position on a backside of the alignment mark when seen from an incidence side of the detection light; and one or more light-transmitting layer portions being laminated between the alignment mark and the light-shielding layer portion so as to transmit the detection light and not being patterned at least in a range that overlaps the light-shielding layer portion.

According to a second aspect of the present invention, in the semiconductor substrate according to the first aspect, a metal wire may be formed in a region on a backside of the light-shielding layer portion when seen from the incidence side of the detection light.

According to a third aspect of the present invention, the semiconductor substrate according to the first or second aspect, the alignment mark may be formed of a metal layer.

According to a fourth aspect of the present invention, in the semiconductor substrate according to any one of the first to third aspects, the light-shielding layer to portion may be formed of a metal layer.

According to a fifth aspect of the present invention, the semiconductor substrate according to any one of the first to fourth aspect may further include a first substrate on which the detection light is incident from the outside; a second substrate being disposed to face the first substrate; and a bonding layer portion that bonds the first and second substrates together, wherein the alignment mark, the light-transmitting layer portion, and the light-shielding layer portion may be provided in the first substrate.

According to a sixth aspect of the present invention, the semiconductor substrate according to any one of the first to fourth aspects may further include: a first substrate on which the detection light is incident from the outside; a second substrate being disposed to face the first substrate; and a bonding layer portion that bonds the first and second substrates together, wherein the alignment mark may be provided in the first substrate, the light-shielding layer portion may be provided in the bonding layer portion, a bonding electrode that electrically bonds the first and second substrates in the bonding layer portion may be formed on an outer side of the light-shielding layer portion, and the light-transmitting layer portion may be formed between the alignment mark of the first substrate and the light-shielding layer portion of the bonding layer portion.

According to a seventh aspect of the present invention, the semiconductor substrate according to any one of the first to fourth aspect may further include: a first substrate on which the detection beam is incident from the outside; a second substrate being disposed to face the first substrate; and a bonding layer portion that bonds the first and second substrates together, wherein the alignment mark may be provided in the first substrate, the light-shielding layer portion may be provided in the second substrate, a bonding electrode that electrically bonds the first and second substrates in the bonding layer portion may be formed on an outer side of a region that overlaps the light-shielding layer portion, and the light-transmitting layer portion may be formed between the alignment mark of the first substrate and the light-shielding layer portion of the second substrate.

According to an eighth aspect of the present invention, an image pickup element may include the semiconductor substrate according to any one of the first to seventh aspects.

According to a ninth aspect of the present invention, an image pickup apparatus may include the semiconductor substrate according to the eighth aspect.

BRIEF DESCRIPTION OF THE DRAWINGS

FIG. 7 is a schematic cross-sectional view illustrating a configuration of an image pickup element according to a first modified example of the embodiment of the present invention.

FIG. 8 is a schematic cross-sectional view illustrating a configuration of an image pickup element according to the first modified example of the embodiment of the present invention.

DETAILED DESCRIPTION OF THE PREFERRED EMBODIMENTS

A semiconductor substrate, an image pickup element, and an image pickup apparatus according to an embodiment of the present invention will be described.

Figure 1:
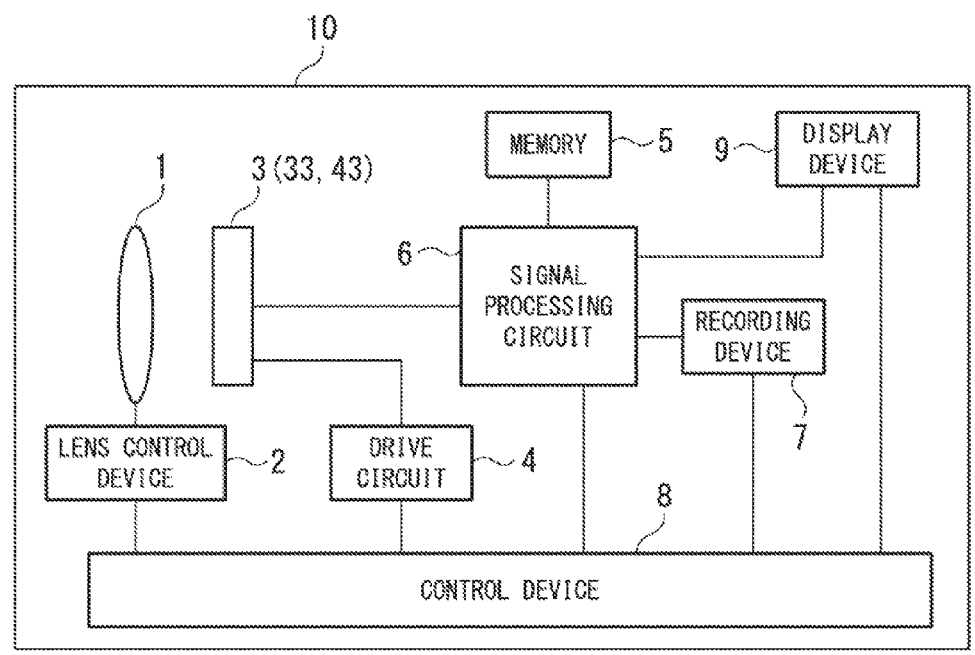
FIG. 1 is a system configuration diagram illustrating a system configuration of an image pickup apparatus according to an embodiment of the present invention.
Figure 2A:
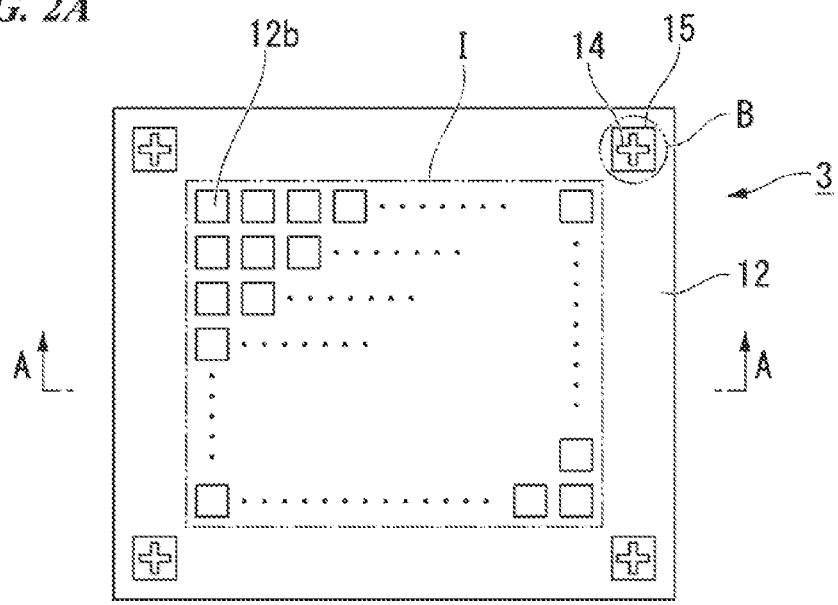
FIG. 2A is a plan view of an image pickup element according to an embodiment of the present invention.
Figure 2B:
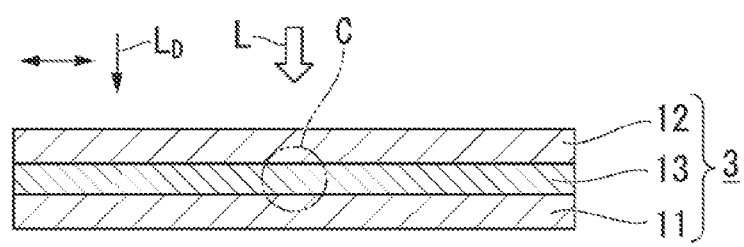
FIG. 2B is a cross-sectional view along A-A in FIG. 2A.
Figure 2C:
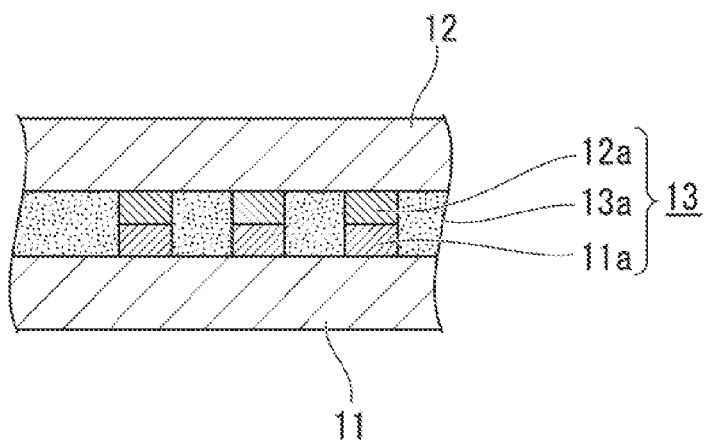
FIG. 2C is a detailed view of a portion indicated by B in FIG. 2B.
Figure 3A:
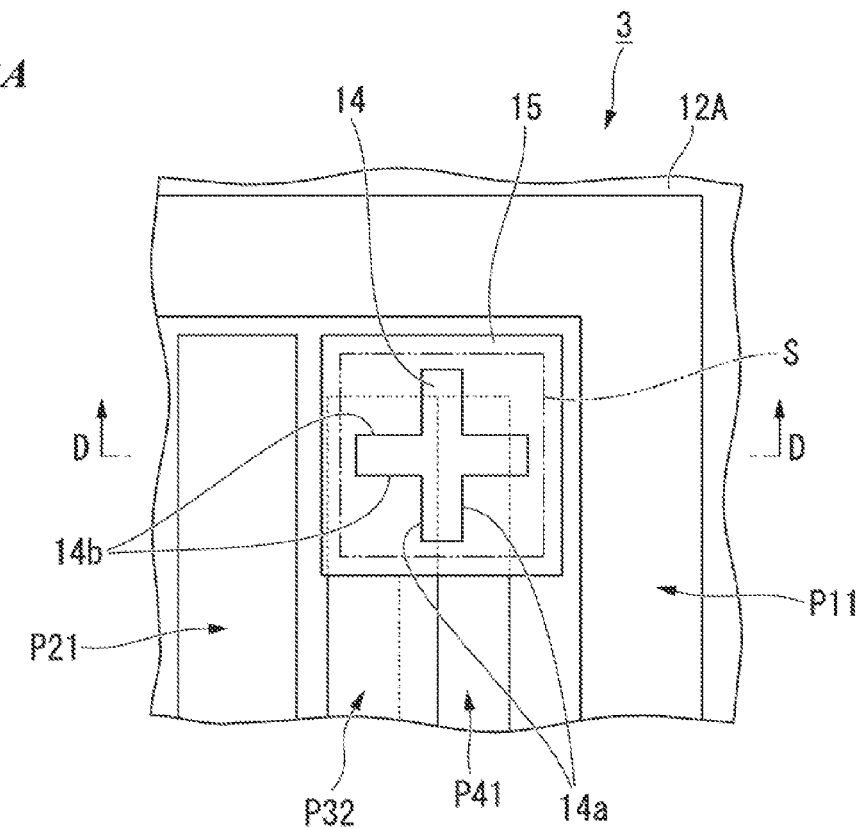
FIG. 3A is a detailed view of a portion indicated by B in FIG. 2A.
Figure 3B:
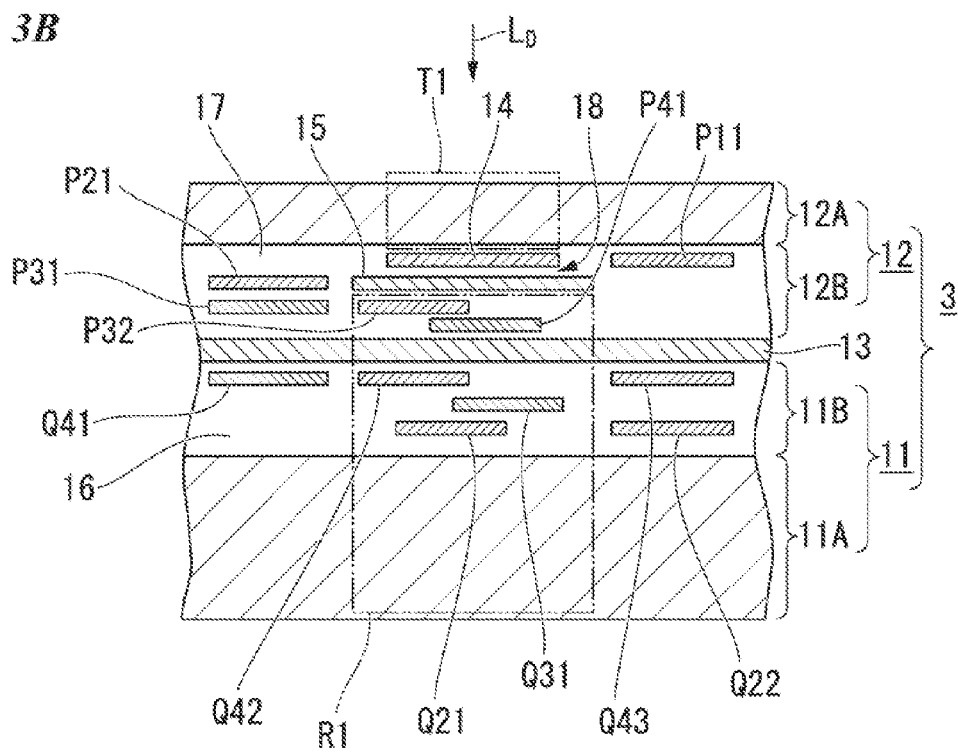
FIG. 3B is a cross-sectional view along line D-D in FIG. 3A.

FIG. 1 is a system configuration diagram illustrating a system configuration of an image pickup apparatus according to an embodiment of the present invention. FIG. 2A is a plan view of an image pickup clement according to an embodiment of the present invention. FIG. 2B is a cross-sectional view along line A-A in FIG. 2A. FIG. 2C is a detailed view of a portion indicated by C in FIG. 2B. FIG. 3A is a detailed view of a portion indicated by B in FIG. 2A. FIG. 3B is a cross-sectional view along line D-D in FIG. 3A.

Since these diagrams are schematic diagrams, the shapes and the dimensions are exaggerated (the same applies to the other drawings).

An image pickup apparatus according to aspects of the present invention may he an electronic apparatus having an image pickup function, and examples thereof include a digital camera, a digital video camera, and an endoscope. In the present embodiment, a digital camera will be described by way of example.

As illustrated in FIG. 1, a digital camera 10 (an image pickup apparatus) according to the present embodiment includes a lens unit 1, a lens controller 2 solid-state image pickup element 3 (an image pickup element or a semiconductor substrate), a driving circuit 4, a memory 5, a signal processing circuit 6, a recording device 7, a controller 8, and a display 9.

The lens unit 1, for example, includes a zoom lens and a focus lens, and allows light from a subject to be imaged on a light-receiving surface of the solid-state image pickup element 3 as a subject image. The lens controller 2 controls a zoom, a focus, an aperture, and the like of the lens unit 1. The light received through the lens unit 1 is imaged on the light-receiving surface of the solid-state image pickup element 3.

The solid-state image pickup element 3 converts the subject image imaged on the light-receiving surface into an image signal and outputs the image signal. A plurality of pixels are arranged two-dimensionally in row and column directions on the light-receiving surface of the solid-state image pickup element 3. A detailed configuration of the solid-state image pickup element 3 will be described later.

The driving circuit 4 drives the solid-state image pickup element 3 to control the operation thereof. The memory 5 stores image data temporarily. The signal processing circuit 6 performs a predetermined process on the image signal output from the solid-state image pickup element 3. Examples of the process performed by the signal processing circuit 6 includes amplification of image signals, various corrections of image data, compression of image data, and the like.

The recording device 7 is formed semiconductor memory or the like for recording or reading image data and is included in the digital camera 10 in a detachable state. The display 9 displays a video image (live-view image) and a still image, video and still images recorded on the recording device 7, the state of the digital camera 10, and other information.

The controller 8 controls the entire digital camera 10. The operation of the controller 8 is defined by a program that is stored in a ROM included in the digital camera 10. The controller 8 reads the program to perform various types of control according to the content defined by the program.

Next, a detailed configuration of the solid-state image pickup element 3 will be described.

As illustrated in FIGS. 2A and 2B, the solid-state image pickup element 3 has a rectangular outer shape in a plan view and is formed of a stacked semiconductor substrate obtained by bonding first and second substrates 12 and 11 which are semiconductor substrates.

A photodetector arrangement region 1 is formed in a central portion of one of the surfaces of the first substrate 12 facing the outside. A plurality of photodetectors 12b formed of photodiodes corresponding to photoelectric conversion pixels are formed at intervals in the photodetector arrangement region 1. In the present embodiment, the photodetectors 12b are arranged in a two-dimensional grid shape having an arrangement direction parallel to the long sides (the sides extending in the horizontal direction in FIG. 2A) and the short sides (the sides extending in the vertical direction in FIG. 2A) of the outer shape in a plan view of the solid-state image pickup element 3.

An on-chip color filter that separates the colors of the incident beam 1. (see FIG. 2B) for acquiring a subject image and an on-chip microlens that focuses the incident beam L on the photodetector 12b, which are not illustrated for the sake of clarity, are formed on each photodetector 12b. Moreover, a light-shielding film for shielding unwanted beams which can cause image noise is formed between the photodetectors 12b and on the outer side of the photodetector arrangement region 1 as necessary.

Alignment marks 14 for detecting the position of the first substrate 12 are formed near the four corners of the photodetector arrangement region 1. The position of the first substrate 12 is detected when performing positioning of an exposure mask during manufacturing steps, for example.

The position detection is performed, for example, by emitting a detection beam $L_D$ from a light source provided in a semiconductor manufacturing apparatus (not illustrated) or the like toward the first substrate 12 as illustrated in FIG. 2B and detecting reflection beams reflected from the alignment marks 14 using a light-detecting unit provided in the semiconductor manufacturing apparatus (not illustrated) or the like.

The detected positions of the alignment marks 14 are used by the semiconductor manufacturing apparatus (not illustrated) when brining an on-chip color filter, an on-chip microlens, a light-shielding film, and the like on the first substrate 12 using a photolithography process or the like, for example.

In the following description, when the positional relations of respective units and portions in a cross-section in the thickness direction of the solid-state image pickup element 3 are referred to, it is assumed that the photodetector 12b is disposed to face upward and the detection beam $L_D$ is incident from the upper side of the photodetector 12b unless specifically stated otherwise.

As illustrated in FIG. 2B, the cross-section in the thickness direction of the solid-state image pickup element 3 has a configuration in which the first substrate 12, the bonding layer portion 13, and the second substrate 11 are stacked in that order.

Circuit portions such as a driving circuit including a metal wire, an electrode, and a device, for example, are formed in the first and second substrates 12 and 11 in order to transfer charges generated by the photodetectors 12b and extract the charges as image signals. Although the respective circuit portions are not illustrated, the circuit portions are disposed so as to be appropriately distributed in the first and second substrates 12 and 11.

As illustrated in FIG. 2C, the bonding layer portion 13 includes bonding electrodes 12a and 11a provided on the facing surfaces of the first and second substrates 12 and 11 so as to face each other and electrically bonded to each other and an adhesive layer 13a that is filled in the gap between the facing surfaces of the first and second substrates 12 and 11 and is solidified so that the first and second substrates 12 and 11 are bonded together.

The bonding electrode 12a (the bonding electrode 11a) is electrically connected to the circuit portions (not illustrated) in the first substrate 12 (the second substrate 11). Thus, the circuit portions disposed to be distributed in the first and second substrates 12 and 11 are electrically connected by the bonding electrodes 12a and 11a.

An appropriate combination of members which can be electrically bonded by pressing, heating, and the like can be used as the bonding electrodes 12a and 11a. For example, a combination of a metal pad and a metal bump, a combination of a metal bump and a metal bump, and other combinations can be used. In the present embodiment, a combination of a metal pad and a metal bump is used as an example.

An epoxy resin, a polyimide resin, and the like, for example, can be used as the adhesive layer 13a. The adhesive layer 13a is not essential, and the adhesive layer may be omitted, for example, when necessary bonding strength is obtained by the bonding force between the bonding electrodes 12a and 11a, or when necessary bonding strength is obtained by bonding the first and second substrates 12 and 11 by surface activated bonding.

Figure 5A:
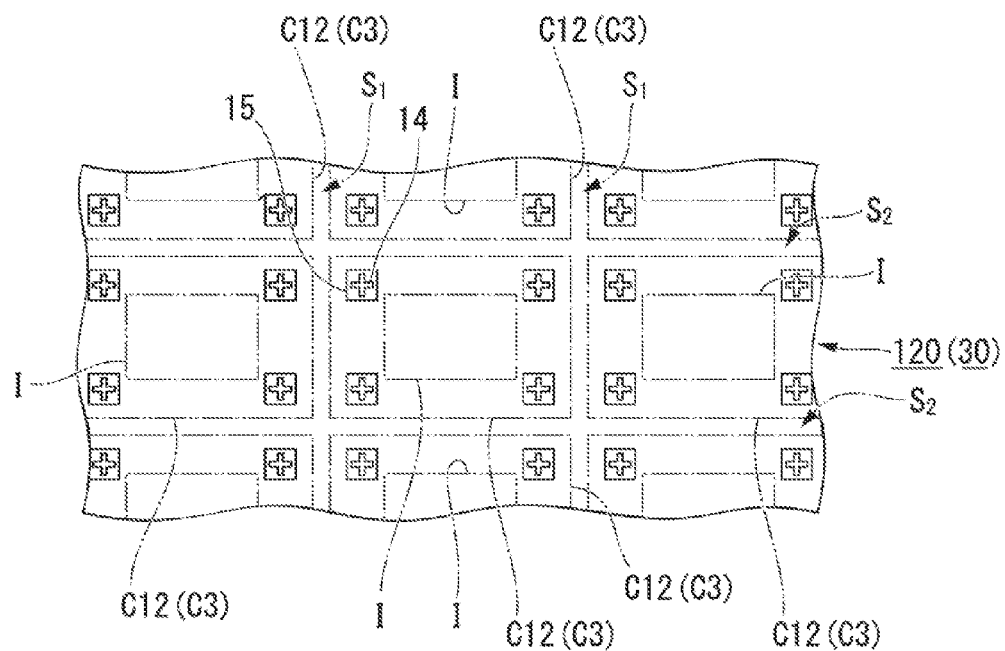
FIG. 5A is a schematic plan view illustrating a first substrate before performing scribing for manufacturing an image pickup element according to at embodiment of the present invention.
Figure 5B:
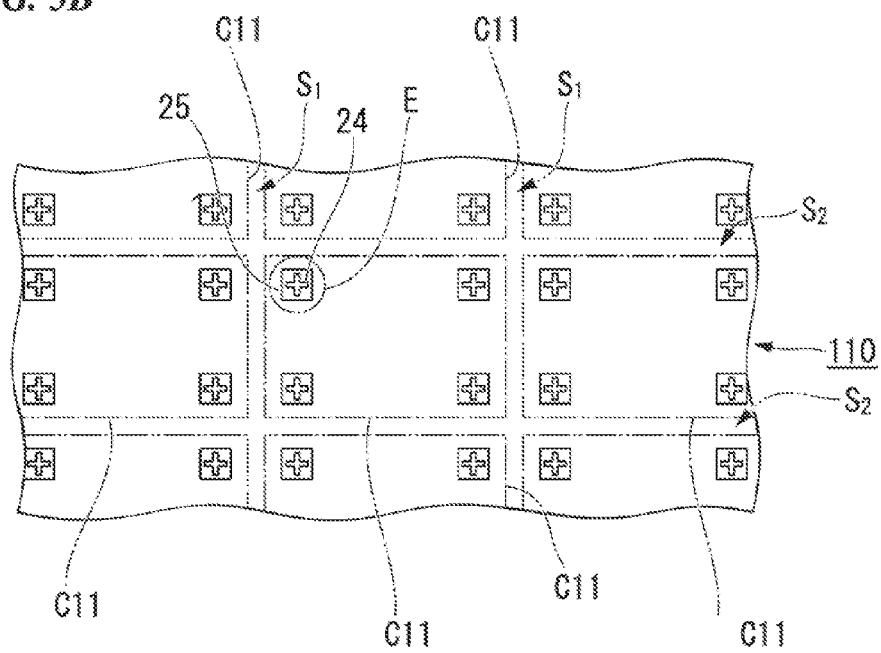
FIG. 5B is a schematic plan view illustrating a second substrate before performing scribing for manufacturing an image pickup element according to an embodiment of the present invention.

FIGS. 5A and 5B illustrate an exemplary plan view and a cross-sectional view near the alignment mark 14 respectively, at an enlarged scale.

As illustrated in FIG. 3B, the first substrate 12 includes a photodetector form 11a layer 12A and a wiring layer 12B formed in an underlayer of the photodetector forming layer 12A.

Here, the photodetector forming layer 12A is a layered portion in which the photodetectors 12b are formed in the photodetector arrangement region 1. However, since the region near the alignment mark 14 is outside the photodetector arrangement region 1, the photodetector 12b is not formed but a layered portion having light-transmitting properties is formed.

The wiring layer 12B is a layered portion in which the circuits and wires of the first substrate 12 are formed and is a layered portion in which an appropriate number of patterned metal wires and oxide film layers are stacked. In FIG. 3B, for the sake of clarity, vias and the like for connecting wires across layers are not illustrated, and a portion other than the metal wires is simply depicted as an oxide film layer 17.

The alignment mark 14 according to the present embodiment is disposed immediately below an oxide film that forms the uppermost layer (the layer bonded to the photodetector forming layer 12A) of the wiring layer 12B and at a position facing the lowermost layer surface of the photodetector forming layer 12A.

Moreover, the alignment mark 14 is formed of a material that reflects the position detection beam $L_D$. Although visible light is generally used as the detection beam $L_D$, light such as infrared (IR) light that is outside the visible wavelength region may be used. Moreover, the type of the light source is not limited, and a laser light may be used, for example.

Examples of a preferred material of the alignment mark 14 include a metal, a nitride film, a resin material having light-shielding properties, and the like.

A metal material used when forming metal wires on the wiring layer 12B is preferably used as the metal used for the alignment mark 14. In the present embodiment, the same material as the metal wire P11 formed around the alignment mark 14 is used. Thus, the alignment mark 14 is formed simultaneously with the metal wire P11 as a metal layer by the same process as the process of forming the metal wire P11.

All materials that can be used as metal wires in the semiconductor manufacturing process can be used as a metal material used for the metal wire P11. Among these materials, aluminum (Al), copper (Cu), and the like, for example, are preferably used.

With such a configuration, an oxide film of the wiring layer 12B and the photodetector forming layer 12A on the outer side of the photodetector arrangement region 1 are stacked in that order on an upper layer side of the alignment mark 14. In the present embodiment, the oxide film and the photodetector forming layer 12A both have a property of transmitting the detection beam $L_D$.

Thus, an upper side of the alignment mark 14 is covered with a light-transmitting region $T_1$, and as illustrated in FIG. 3A, the outer shape of the alignment lark 14 can be observed as indicated by a solid line when the solid-state image pickup element 3 is seen from above.

However, when the photodetector forming layer 12A is too thick and the detection beam $L_D$ is visible light, the detection beam $L_D$ may be unable to pass through the photodetector forming layer 12A. In this case, the photodetector forming layer 12A above the alignment mark 14 may be removed to form an opening, and the opening may be buried with a sacrificial material or the like that transmits visible light necessary.

Moreover, an IR beam that can easily pass through the photodetector forming layer 12A may be used as the detection beam $L_D$.

The plan-view shape of the alignment mark 14 is not particularly limited as long as the shape has edge portions for detecting the outer shape. In the present embodiment, the alignment mark 14 is formed as a cross mark as an example.

Thus, the alignment mark 14 includes linear portions that extend in the vertical and horizontal directions of FIG. 3A and cross at a right angle and edge portions 14a and 14b (detection edge portions) formed on both sides in the width direction of the respective linear portions.

The edge portions 14a and 14b extend in parallel to the two-dimensional arrangement direction of the photodetectors 12b in the photodetector arrangement region 1.

Moreover, the alignment mark 14 has a size that is slightly smaller than the size of a detection region S set to detect the position of the alignment mark 14 and that can be covered with the detection region S.

Examples of other preferred shapes of the alignment mark 14 include a square a rectangle, other polygonal shapes, an L-shape, a circle, an ellipse, and the like. Moreover, a shape obtained by combining a plurality of these shapes may be used. For example, a slit-shaped mark in which narrows rectangles are disposed in parallel in the lateral direction may be used.

A light-shielding layer portion 15 is formed on a underlayer side of the alignment mark 14 (that is, the position on the backside of the alignment mark 14 when seen from the incidence side of the detection beam $L_D$) with an interlayer oxide film 18 interposed therebetween. The interlayer oxide film 18 has a uniform thickness and transmits the detection beam $L_D$.

Thus, the interlayer oxide film 18 is stacked between the alignment mark 14 and the light-shielding layer portion 15 and forms a light-transmitting layer portion that transmits the detection beam $L_D$ and is not patterned at least in a region that overlaps the light-shielding layer portion 15.

The light-shielding layer portion 15 has an outer shape that is larger than the outer shape of the alignment mark 14 and the detection region S and is formed of a material that shields the detection beam $L_D$. In the present embodiment, the light-shielding layer portion 15 has a rectangular outer shape in a plan view as an example.

On the underlayer side of the light-shielding layer portion 15, to region within the range of the light-shielding layer portion 15 is shielded from the detection beam $L_D$ having passed through the lateral sides of the alignment mark 14. Thus, a light-shielded region R1 (see FIG. 3B) that crosses the wiring layer 12B, the bonding layer portion 13, and the second substrate 11 in the thickness direction is formed on the underlayer side of the light-shielding layer portion 15.

A material of the light-shielding layer portion 15 is not particularly limited as long as the material can shield the detection beam $L_D$. Examples of a preferred material of the light-shielding layer portion 15 include a metal, a nitride film, a resin material having light-shielding properties, and the like.

The light-shielding layer portion 15 may have such light-shielding properties that the outer shape of the alignment mark 14 can be obtained with satisfactory contrast when the detection beam $L_D$ is emitted, and the reflectance thereof is not particularly limited.

For example, the reflectance of the light-shielding layer portion 15 may be set to be higher than the reflectance of the alignment mark 14 so that a reflectance difference can be created. In this case, sit since the alignment mark 14 appears as a dark portion on the light-shielding layer portion 15 that appears as a bright portion, by setting reflectance difference appropriately, it is possible to obtain satisfactory contrast.

In this configuration, since a reflection beans reflected from the light-shielding layer portion 15 and returning to the upper side is shielded by the alignment mark 14 and is scattered in the edge portions 14a and 14b, the outer shape of the alignment mark 14 can be detected. However, since an image is likely to blur when the distance between the light-shielding layer portion 15 and the alignment mark 14 increases, the distance between the light-shielding layer portion 15 and the alignment mark 14 is preferably set to be small in order to obtain satisfactory contrast.

Moreover, the reflectance of the light-shielding layer portion 15 may be set to lower than the reflectance of the alignment mark 14 so that a reflectance difference can be created. In this case, since the alignment mark 14 appears as a bright portion on the light-shielding layer portion 15 that appears as a dark portion, by setting a reflectance difference appropriately, it is possible to obtain satisfactory contrast.

In this case, since the position of the alignment mark 14 can be detected based on the reflection beam reflected from the alignment mark 14, the distance between the light-shielding layer portion 15 and the alignment mark 14 does not affect the contrast. Thus, it is more preferable than when the alignment mark 14 is used as a dark portion because the degree of freedom in the arrangement position of the light-shielding layer portion 15 increases.

When the reflectance of the light-shielding layer portion 15 is set to be lower than that of the alignment mark 14, the reflectance of the light-shielding layer portion 15 may be 0% and a light-absorbing material can be used for the light-shielding layer portion 15.

Moreover, when a micro-uneven structure is formed on the surface of the light-shielding layer portion 15 to provide light-scattering properties, the contrast can be improved further.

Moreover, since the light-shielding layer portion 15 and the alignment mark 14 are separated from each other, even if the reflectances thereof are the same, scattering occurs due to the edge portions 14a and 14b of the alignment mark 14. Thus, it is possible to obtain an edge image shape of the outer shape of the alignment mark 14 along the edge portions 14a and 14b.

In the present embodiment, as an example, the light-shielding layer portion 15 is formed of a dummy electrode portion which is a metal layer formed by the same process as a metal wire P21 of the same material as the metal wire P11 that is formed on the lateral sides of the alignment mark 14.

Thus, in the present embodiment, the light-shielding layer portion 15 is formed of a material having the same reflectance as the alignment mark 14.

In this case, since the light-shielding layer portion 15 can be formed simultaneously with the metal wire P21 by the same process as the metal wire P21, it is preferable because the number of processes can be reduced.

A metal wire P31 is formed in a region of the wiring layer 12B overlapping the metal wire P21 on the lateral sides of the light-shielded region R1, located on the underlayer side of the light-shielding layer portion 15.

A metal wire P32 of which the end enters the light-shielded region R1 is formed on the same layer as the metal wire P31.

A metal wire P41 which partially overlaps the metal wire P32 and of which the end enters the light-shielded region R1 is formed on the underlayer side of the metal wire P32.

An appropriate metal material selected from the materials that can also be used for the metal wire P11 may be used for these metal wires P31, P32, and P41 depending on the use. In the present embodiment, as an example, the metal wires P31, P32, and P41 are formed of the same material as the metal wire P11.

Thus, when the region near the alignment mark 14 is seen from above, as illustrated in FIG. 3A, an outer shape of a metal wire positioned on the upper layer side among the metal wires can be observed. Thus, since the ends of the metal wires P32 and P41 entering the light-shielded region R1 are covered with the light-shielding layer portion 15, the outer shape thereof is not observed.

The metal wires in the wiring layer 12B described above are connected layers by vias (not illustrated) or the like and are electrically connected to the bonding electrode 12a (see FIG. 2C, not illustrated in FIG. 3B) that is formed on a lower surface of the wiring layer 12B.

In the present embodiment, the bonding electrode 12a may be formed at any position on the lower surface of the wiring layer 12B and may be formed within the range of the light-shielded region R1, for example.

As illustrated in FIG. 3B, the second substrate 11 includes a semiconductor lacer 11A formed of a wafer and a wiring layer 11B that is formed on an upper layer of the semiconductor layer 11A and includes a plurality of layers.

The wiring layer 11B is a layered portion in which the circuits and wires of the second substrate 11 are formed and is a layered portion in which an appropriate number of patterned metal wires and oxide film layers are stacked. Similarly to the wiring layer 12B, vias and the like for connecting the metal wires across layers are not illustrated, and a portion excluding the metal wires is simply depicted as an oxide film layer 16.

As metal wires of the wiring layer 11B, metal wires Q41 and Q43 are formed under the metal wires P21 and P11, respectively, and a metal wire Q22 is formed under the metal wire Q43.

In the range of the light-shielded region R1, the metal wires Q42, Q31, and Q21 three-layer structure and partially overlap in the thickness direction.

An appropriate metal material selected from the materials that can also be used for the metal wire P11 may be used for the metal wires Q41, Q42, Q43, Q31, Q21, and Q22 depending on the use. In the present embodiment, as an example, the metal wires Q41, Q42, Q43, Q31, Q21, and Q22 are formed of the same material as the metal wire P11.

The metal wires in the wiring layer 11B described above are connected across layers by vias (not illustrated) or the like and are electrically connected to the bonding electrode 11a (see FIG. 2C, not illustrated in FIG. 3B) that is formed on an upper surface of the wiring layer 11B.

The bonding electrodes 11a are formed at the positions facing the respective bonding electrodes 12a of the first substrate 12. Thus, the bonding electrodes 11a and 12a can be formed within the range of the light-shielded region R1.

Such a solid-state image pickup element 3 can be manufactured in the following manner.

Figure 4:
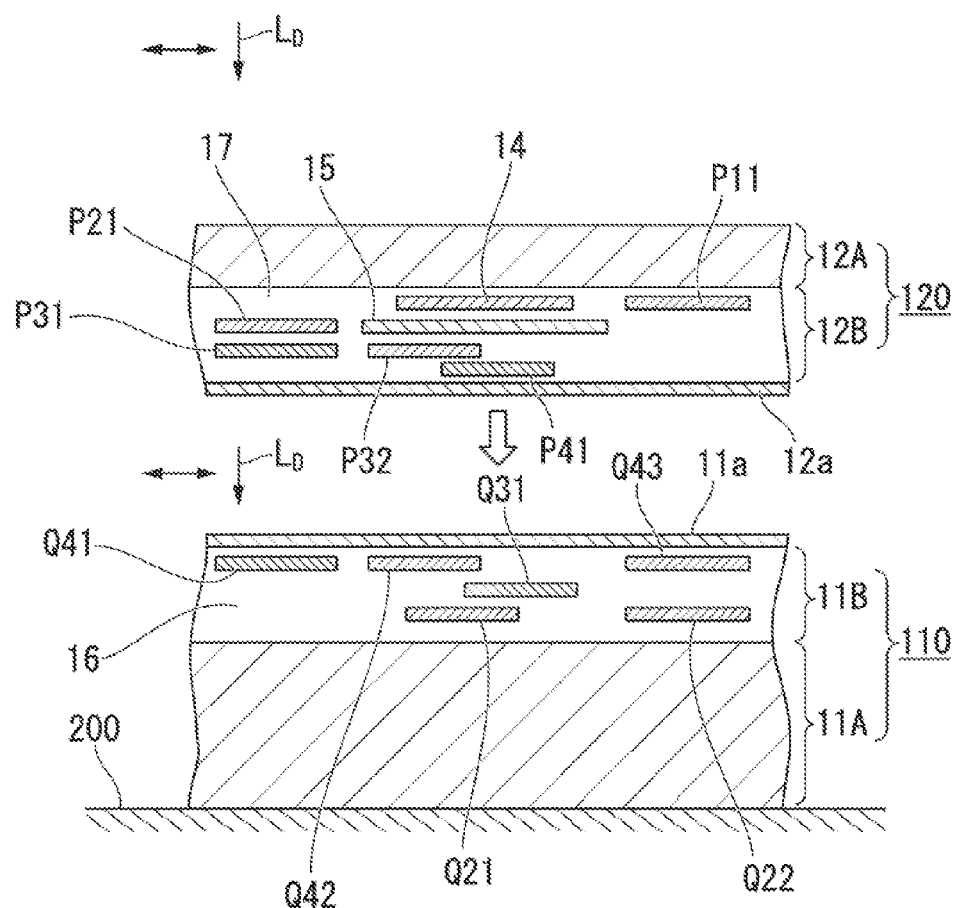
FIG. 4 is a schematic diagram for describing a step of bonding substrates of an image pickup element according to an embodiment of the present invention.
Figure 6A:
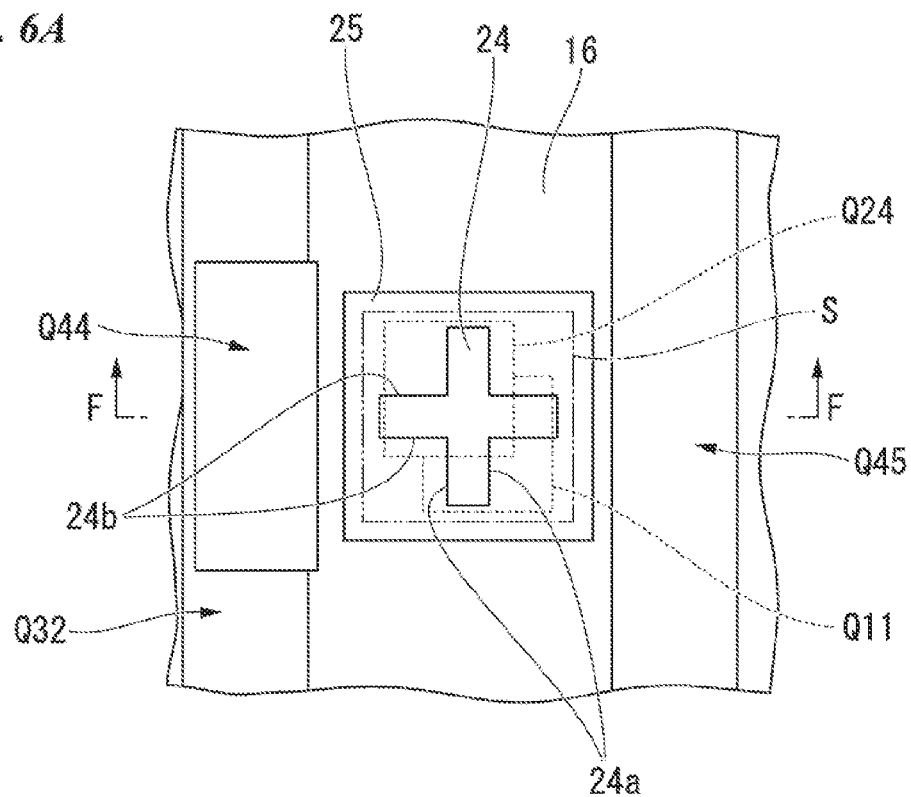
FIG. 6A is a detailed view of a portion indicated by E in FIG. 5B.
Figure 6B:
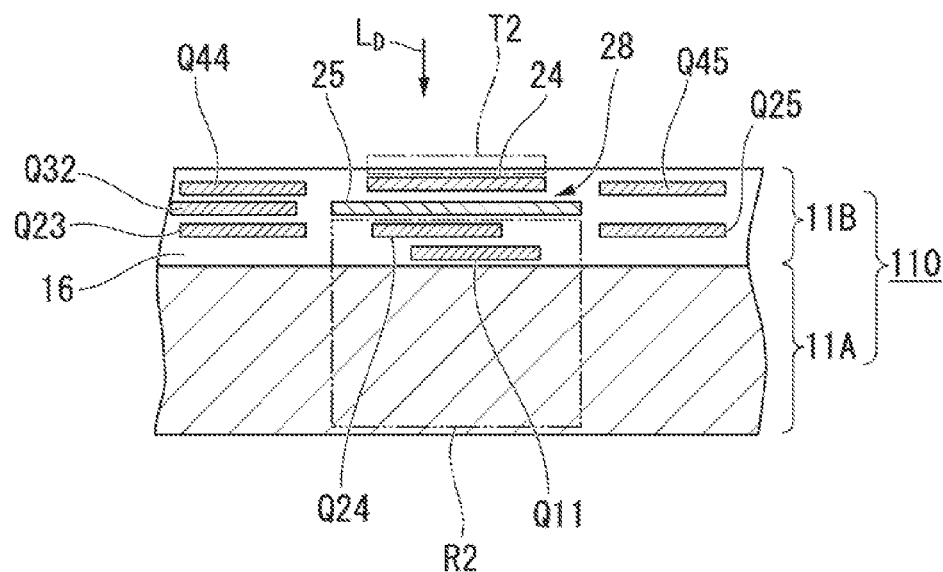
FIG. 6B is a cross-sectional view along line F-F in FIG. 6A.

FIG. 4 is a schematic diagram for describing a step of bonding substrates of an image pickup element according to an embodiment of the present invention. FIG. 5A is a schematic plan view illustrating a first substrate before performing scribing for manufacturing an image pickup element according to an embodiment of the present invention. FIG. 5B is a schematic plan view illustrating a second substrate before performing scribing for manufacturing an image pickup element according to an embodiment of the present invention. FIG. 6A is a detailed view of a portion indicated by E in FIG. 5B. FIG. 6B is a cross-sectional view along line F-F in FIG. 6A.

First, as illustrated in FIG. 4 illustrating a partial shape, a first wafer substrate 120 (semiconductor substrate) and a second wafer substrate 110 (semiconductor substrate) in which a plurality of first and second substrates 12 and 11, respectively, are arranged two-dimensionally are manufactured on a semiconductor wafer by a well-known semiconductor manufacturing process.

The bonding electrode 12a is formed on a surface (the lower side in the drawing) of the wiring layer 12B of the first wafer substrate 120.

The bonding electrode 11a is formed on a surface (the upper side in the drawing) of the wiring layer 11B of the second water substrate 110.

However, in FIG. 4, the individual arrangement positions of the bonding electrodes 12a and 11a are not illustrated but are depicted schematically in a layer form.

As illustrated in FIG. 5A, when the first wafer substrate 120 is seen from the surface on which the photodetector forming layer 12A is formed, rectangular chip areas C12 that form the first substrate 12 after scribing is performed as will be described later are arranged in parallel two-dimensionally with scribing regions $S_1$ and $S_2$ interposed therebetween. The scribing regions $S_1$ and $S_2$ are orthogonal to each other and provided in a rectangular grid form.

The alignment marks 14 that overlap the upper side of the light-shielding layer portion 15 are observed at the our corners of each chip area C12. Thus, by detecting the positions of the alignment marks 14, it is possible to detect the position of the chip area C12 and the positions of the scribing regions $S_1$ and $S_2$.

As illustrated in FIG. 5B, when the second wafer substrate 110 is seen from the surface on which the wiring layer 11B is formed, rectangular chip areas C11 that form the second substrate 11 after scribing is performed as will be described later are arranged in parallel two-dimensionally with the scribing regions $S_1$ and $S_2$ interposed. The scribing regions $S_1$ and $S_2$ are orthogonal to each other and provided in a rectangular grid form.

In the present embodiment, alignment marks 24 are provided in each chip area C11 so that the alignment marks 24 are observable from the surface close to the wiring layer 11B.

The alignment marks 24 are provided in carder to detect the position of the second wafer substrate 110 when the second wafer substrate 110 and the first wafer substrate 120 are bonded together.

In FIG. 5B, although the alignment marks 24 are to led at the four corners of the chip area C11, it is not necessary to form the alignment marks 24 at the same positions as the alignment marks 14.

Moreover, the positions and the number of alignment marks 24 are not limited to those illustrated as long as the positions of the chip areas C11 of the second wafer substrate 110 can be detected. For example, a different lumber of alignment marks 24 may be formed at other positions of the chip area C11. Moreover, the alignment marks 24 may be formed in the scribing regions $S_1$ and $S_2$ because the alignment marks 24 are not used for detecting positions after the second wafer substrate 110 is bonded to the first wafer substrate 120.

As illustrated in FIGS. 6A and 6B, the alignment mark 24 is disposed in a portion of the wiring layer 11B in which the bonding electrodes 11a are not formed and which is located immediately below the oxide film that forms the uppermost layer. Thus, the upper side of the alignment mark 24 is covered with a light-transmitting region T2.

Moreover the alignment mark 24 is formed of the same material as the alignment mark 14 and has the same outer shape as the alignment mark 14.

That is, in the present embodiment, the alignment mark 24 is formed as a metal layer by the same process as the metal wires Q44 and Q45 formed around the alignment mark 24. An appropriate metal material selected from the materials that can also be used for the metal wire P11 may be used for the alignment mark 24 and the metal wires Q44 and Q45.

Due to this, the oxide film of the wiring layer 11B having a property of transmitting the detection beam $L_D$ is stacked on the upper layer side of the alignment mark 24. Thus, as illustrated in FIG. 5B, the outer shape of the alignment mark 24 can be observed as indicated by a solid line when seen from above.

Moreover, a plan-view shape of the alignment mark 24 can be selected appropriately from the shapes that can be used as the alignment mark 14. In the present embodiment, the alignment mark 24 is formed as a cross mark as an example. Thus, the alignment mark 24 includes linear portions that extend in the vertical and horizontal directions of FIG. 6A and cross at a right angle and edge portions 24a and 24b (detection edge portions) formed on both sides in the width direction of the respective linear portions.

The edge portions 24a and 24b extend in parallel to the two-dimensional arrangement direction of the chip areas C11.

Moreover, the alignment mark 24 has a size that is slightly smaller than the size of the detection region S of the semiconductor manufacturing apparatus and that can be covered with the detection region S similarly to the alignment mark 14.

A light-shielding layer portion 25 that is formed of a material selected from the same preferable materials as the light-shielding layer portion 15 and has the same shape as the light-shielding layer portion 15 is formed on an underlayer side of the alignment mark 24 (that is, the position on the backside of the alignment mark 24 when seen from the incidence side of the detection beam $L_D$) with an interlayer oxide film 28 interposed therebetween. The interlayer oxide film 28 has a uniform thickness and transmits the detection beam $L_D$.

Thus, the interlayer oxide film 28 is stacked between the alignment mark 24 and the light-shielding layer portion 25 and forms a light-transmitting layer portion that transmits the detection beam $L_D$ and is not patterned at least in a region that overlaps the light-shielding layer portion 25.

The light-shielding layer portion 25 is formed of a dummy electrode portion which is a metal layer formed by the same process as the metal wire Q32 that is formed on the lateral sides of the alignment mark 24 closer to the underlayer side of the metal wire Q44.

A plan-view shape of the light-shielding layer portion 25 is not particularly limited similarly to the light-shielding layer portion 15, and in the present embodiment, the light-shielding layer portion 25 is formed in a rectangular form in a plan view as an example.

An appropriate metal material selected from the materials that can also be used for the metal wire P11 may be used for the metal wins formed in the wiring layer 11B depending on the use. In the present embodiment, as an example, the metal wires are formed of the same material as the metal wire P11.

Thus, in the present embodiment, the light-shielding layer portion 25 is formed of a material having the same reflectance as the alignment mark 24.

Examples of other preferred materials of the light-shielding layer portion 25 include a nitride film, a resin material having light-shielding properties, and the like similarly to the light-shielding layer portion 15.

The detection beam $L_D$ having passed through the lateral sides of the alignment mark 24 is shielded by the light-shielding layer portion 25. Due to this, a light-shielded region R2 is formed on the underlayer side of the light-shielding layer portion 25.

A metal wire Q23 is formed in a region of the wiring layer 11B overlapping the metal wires Q32 and Q44 on the lateral sides of the light-shielded region R2, located on the underlayer side of the light-shielding layer portion 25.

A metal wire Q24 formed inside the light-shielded region R2 is formed on the same layer as the metal wire Q23. A metal wire Q11 which partially overlaps the metal wire Q24 and is formed inside the light-shielded region R2 is formed on the underlayer side of the metal wire Q24.

Thus, when the region near the alignment mark 24 is seen from above, as illustrated in FIG. 6A, an outer shape of a metal wire positioned on the upper layer side among the metal wires can be observed. Thus, since the metal wires Q24 and Q11 entering the light-shielded region R2 are covered with the light-shielding layer portion 25, the outer shape thereof is not observable.

Subsequently, the first and second wafer substrates 120 and 110 having such a configuration are aligned with each other and bonded together.

For example, as illustrated in FIG. 4, the first wafer substrate 120 is placed in a state in which the second wafer substrate 110 is placed on a mounting table 200 of a semiconductor manufacturing apparatus with the wiring layer 11B facing upward.

In this case, in the present embodiment, since surface activated bonding, is performed, argon (Ar) ions, for example, are radiated to the bonding electrodes 12a to activate the surfaces of the bonding electrodes 11a.

Subsequently, the detection beam $L_D$ is emitted from the upper side of the second wafer substrate 110 and the reflection beam is detected using a detector to detect the edges in the detection region S.

When the detection region S reaches a range that covers the alignment mark 24, the detection beam $L_D$ is reflected from the surfaces of the alignment mark 24 and the light-shielding layer portion 25 approximately uniformly and the reflection beam returns upward. In this case, in the present embodiment, there is no reflectance difference between the alignment mark 24 and the light-shielding liner portion 25. However, since scattering occurs in the edge portions 24a and 24b of the alignment mark 24, a change in light intensity occurs in the edge portions 24a and 24b and the outer shape of the alignment mark 24 is detected.

Moreover, since the detection beam $L_D$ does not reach the light-shielded region R2 on the underlayer side of the light-shielding layer portion 25, the edge portions of the metal wires Q24 and Q11 are not detected.

When the alignment mark 24 is detected in the detection region S by such edge-detection, the detected position is stored.

Subsequently, as illustrated in FIG. 4, a holder (not illustrated) of the semiconductor manufacturing apparatus holds the first wafer substrate 120 above the second wafer substrate 110 so that the photodetector forming layer 12A is on the upper side.

In this case, in the present embodiment, since surface activated bonding is performed, argon (Ar) ions, for example, are radiated to the bonding electrodes 12a to activate the surfaces of the bonding electrodes 12a.

After that, the detection beam $L_D$ is emitted from the upper side of the first wafer substrate 120 and the reflection beam is detected using a detector to detect the edges in the detection region S to thereby detect the alignment mark 14.

When the detection region S reaches a range that covers the alignment mark 14, similarly to the case of the alignment mark 24, since scattering occurs in the edge portions 14a and 14b of the alignment mark 14, a change in light intensity occurs in the edge portions 14a and 14b and the outer shape of the alignment mark 14 is detected.

Moreover, since the detection beam $L_D$ does not reach the light-shielded region R1 on the underlayer side of the light-shielding layer portion 15, the edge portions of the metal wires P32, P41, P42, Q42, Q31, and Q21 are not detected.

Even when the bonding electrodes 12a and 11a are formed in the bonding layer portion 13, the images thereof are not detected similarly.

When the alignment mark 14 is detected in the detection region S by such edge-detection, the semiconductor manufacturing apparatus calculates a difference in detected positions between the alignment marks 14 and 24 to calculate an amount of movement for aligning the first wafer substrate 120. Then, the semiconductor manufacturing apparatus moves the holding position of the first wafer substrate 120 to a position at which the bonding electrodes 12a of the second lifer substrate 110 face the bonding electrodes 11a of the second water substrate 110.

Subsequently, the first wafer substrate 120 is lowered toward the second wafer substrate 110 and pressed so that the bonding electrodes 12a and 11a are bonded by surface activated bonding.

When the bonding electrodes 12a and 11a are bonded together, an adhesive layer 13a is filled between the wiring layers 12B and 11B and is solidified so that the first and second wafer substrates 120 and 110 are bonded in the thickness direction.

As a result, as illustrated in FIG. 5A, a wafer substrate laminate 30 (semiconductor substrate) in which the chip areas C11 (not illustrated) of the second wafer substrate 110 overlap the ranges that overlap the chip areas C12 of the first wafer substrate 120, respectively, and chip areas C3 having the configuration of the solid-state image pickup element 3 are arranged two-dimensionally is formed.

Subsequently, the wafer substrate laminate 30 is scribed along the scribing regions $S_1$ and $S_2$ to cut the respective chip areas C3.

In this case, the positions of the scribing regions $S_1$ and $S_2$ can be detected using the alignment marks 14 on the first wafer substrate 120.

In this way, such a solid-state image pickup element 3 as illustrated in FIG. 2A is manufactured.

According to the present embodiment, the light-shielding layer portion 15 (25) is provided on the backside of the alignment mark 14 (24) and the interlayer oxide film 18 which is a light-transmitting layer portiere is stacked between the alignment mark 14 (24) and the light-shielding layer portion 15 (25). Thus, a decrease in detection accuracy of the alignment mark 14 (24) can be prevented.

Further, even when patterned portions such as a metal wire, for example, are disposed in the range of the light-shielded region R1 (R2) on the underlayer side of the light-shielding layer portion 15 (25), the detection accuracy of the alignment mark 14 (24) does not change.

Due to this, patterned portions such as a metal wire, a circuit portion, or a bonding electrode, for example, can be stacked and arranged its the light-shielded region R1 (R2). Thus, even when the number of arrangement positions of the alignment marks 14 (24) is increased, since it is not necessary to form a dedicated region for arranging the alignment marks 14 (24), it is possible to suppress an increase in a chip area and a scribe line area. Therefore, since it is not necessary to decrease the number of chips per wafer, the manufacturing cost can be reduced.

When a plurality of semiconductor substrates are stacked like the solid-state image pickup element 3, alignment marks used when manufacturing individual semiconductor substrates and alignment marks for detecting positions when stacking these semiconductor substrates are required. Thus, the number of alignment marks increases remarkably as compared to one semiconductor substrate.

According to the configuration of the present embodiment, in the case of such a stacked semiconductor substrate, it is possible to suppress an increase in a chip area and a scribe line area effectively.

(First Modified Example)

Next, an image pickup element according to a first modified example of the present embodiment will be described.

FIG. 7 is a schematic cross-sectional view illustrating a configuration of an image pickup element according to a first modified example of the embodiment of the present invention.

As illustrated in FIG. 7, a solid-state image pickup element 33 (an image pickup element, a semiconductor substrate) according to the present modified example has a configuration in which a first substrate 32 (semiconductor substrate) is provided instead of the first substrate 12 of the solid-state image pickup element 3 according to the embodiment, and a light-shielding layer portion 35 is added in the bonding layer portion 13.

As illustrated in FIG. 1, the solid-state image pickup element 33 can be used instead of the solid-state image pickup element 3 of the digital camera 10 according to the embodiment.

Hereinafter, differences from the embodiment will be mainly described.

The first substrate 32 includes a wiring layer 32B instead of the wiring layer 12B of the first substrate 12 according to the embodiment.

The wiring layer 32B has a configuration in which the light-shielding layer portion 15 and the metal wires P32 and P41 in the light-shielded region R1 are removed from the wiring layer 12B, and the space corresponding to the removed portions is replaced with an oxide film layer 17 in which a plurality of interlayer oxide films that transmit the detection beam $L_D$ and have a uniform thickness are stacked.

The light-shielding layer portion 35 is disposed at a different position in the thickness direction from the light-shielding layer portion 15 according to the embodiment, but the material and shape thereof are the same as those of the light-shielding layer portion 15. However, the bonding electrodes 12a and 11a are not formed in the range that overlaps the light-shielding layer portion 35.

When the adhesive layer 13a is used for the bonding layer portion 13, the arrangement position in the thickness direction of the light-shielding layer portion 35 in the bonding layer portion 13 is not particularly limited. For example, as illustrated in FIG. 7, the light-shielding layer portion 35 may be disposed in the uppermost portion of the bonding layer portion 13.

Moreover, although not illustrated in the drawing, the light-shielding layer portion 35 may be disposed in an intermediate portion in the thickness direction of the bonding layer portion 13 and may be disposed in the lowermost portion in the thickness direction of the bonding layer portion 13.

When the light-shielding layer portion 35 and the wiring layer 32B are spaced from each other according to the arrangement position, a layered portion such as the adhesive layer 13a, for example, that transmits the detection beam $L_D$ is filled in the gap.

However, when the first and second substrates 32 and 11 are bonded without using the adhesive layer 13a, the light-shielding layer portion 35 may be in close contact with any one of the wiring layers 11B and 32B and a gap may remain between the other wiring layer and the light-shielding layer portion 35.

Moreover, the light-shielding layer portion 35 may be formed to the same thickness as the bonding layer portion 13.

With such a configuration, a light-transmitting layer portion 38 which transmits the detection beam $L_D$ and which includes at least one layered portion that is not patterned at least in the range that overlaps the light-shielding layer portion 35 is formed between the upper surface of the light-shielding layer portion 35 and the lower surface of the alignment mark 11. The light-transmitting layer portion 38 includes at least the oxide film layer 17 and includes the adhesive layer 13a and a void portion according to the position of the light-shielding layer portion 35.

A light-shielded region R31 that crosses at least the second substrate 11 and crosses a portion of the bonding layer portion 13 according to the arrangement position of the light-shielding layer portion 35 is formed on the underlayer side of the light-shielding layer portion 35.

In the case of the configuration illustrated in FIG. 7, such a solid-state image pickup element 33 can be manufactured similarly to the embodiment, except that, for example, after chip areas having the configuration of the first substrate 32 are arranged to form the first wafer substrate, the light-shielding layer portion 35 is formed on the surface of the wiring layer 32B, and the first wafer substrate is bonded to the second wafer substrate 110.

Similarly, a configuration corresponding to other arrangement positions (not illustrated) can be manufactured by forming the light-shielding layer portion 35 on the wiring layer 11B and forming the light-shielding layer portion 35 after the layered portion of the adhesive layer 13a is formed on the wiring layer 32B or 11B.

According to the present modified example, the light-shielding layer portion 35 is provided on the backside of the alignment mark 14 and the light-transmitting layer portion 38 is stacked between the alignment mark 14 and the light-shielding layer portion 35. Thus, a decrease in detection accuracy of the alignment mark 14 can be prevented.

Moreover, patterned portions such as a metal wire a circuit portion, or a bonding electrode, can be stacked and arranged in the light-shielded region R31. Thus even when the number of arrangement positions of the alignment marks 14 is increased, since it is not necessary to form a dedicated region for arranging the alignment marks 14, it is possible to suppress an increase in a chip area and a scribe line area. Therefore, since it is not necessary to decrease the number of chips per wafer, the manufacturing cost can be reduced.

Moreover, similarly to the embodiment, in the case of such a stacked semiconductor substrate, it is possible to suppress an increase in a chip area and a scribe line area effectively.

(Second Modified Example)

Next, an image pickup element according to a second modified example the present embodiment will be described.

FIG. 8 is a schematic cross-sectional view illustrating a configuration of an image pickup element according to the second modified example of the embodiment of the present invention.

An illustrated in FIG. 8, a solid-state image pickup element 43 (an mage pickup element, a semiconductor substrate) according to the present modified example has a configuration in which a second substrate 41 (semiconductor substrate) is provided instead of the second substrate 11 of the solid-state image pickup element 33 according to the first modified example, and the light-shielding layer portion 35 is removed.

As illustrated in FIG. 1, the solid-state image pickup element 43 can be used instead of the solid-state image pickup element of the digital camera 10 according to the embodiment.

Hereinafter, differences from the embodiment and the first modified example will be mainly described.

The second substrate 41 includes a wiring layer 41B instead of the wiring layer 11B of the second substrate 11 according to the embodiment.

The wiring layer 41B has a configuration in which the metal wires Q42 and Q31 in the light-shielded region R1 according to the embodiment are removed from the wiring layer 11B, the space corresponding to the removed portions is replaced with an oxide film layer 16 in which a plurality of interlayer oxide films that transmit the detection beam $L_D$ and have a uniform thickness are stacked, and a light-shielding layer portion 45 is disposed at a position in the range of the light-shielded region R1 according to the embodiment in the oxide film layer 16 located above the metal wire Q21.

The light-shielding layer portion 45 is disposed at a different position in the thickness direction from the light-shielding layer portion 15 according to the embodiment, but the material and shape thereof are the same as those of the light-shielding layer portion 15. However, the bonding electrodes 12a and 11a are not formed in the range that overlaps the light-shielding layer portion 45, similarly to the first modified example.

With such a configuration, a light-transmitting layer portion 48 which transmits the detection beam $L_D$ and which includes at least one layered portion that is not patterned at least in the range that overlaps the light-shielding layer portion 45 and that includes the oxide film layer 17, the bonding layer portion 13, and the oxide film layer 16 is formed between the upper surface of the light-shielding layer portion 45 and the lower surface of the alignment mark 14.

A light-shielded region R41 that crosses a portion of the wiring layer 41B and the semiconductor layer 11A is formed on the underlayer side of the light-shielding layer portion 45.

Such a solid-state image pickup element 43 can be manufactured similarly to the embodiment, except that, after the first water substrate in which the chip areas having the configuration of the first substrate 32 are arranged and the second wafer substrate in which the chip areas having the configuration of the second substrate 41 are arranged are formed, the first and second wafer substrates are bonded together.

According to the present modified example, the light-shielding layer portion 45 is provided on the backside of the alignment mark 14 and the light-transmitting layer portion 48 is stacked between the alignment mark 14 and the light-shielding layer portion 45. Thus a decrease in detection accuracy of the alignment mark 14 can be prevented.

Moreover, patterned portions such as a metal wire, a circuit portion, or a bonding electrode, for example, can be stacked and arranged in the light-shielded region R41. Thus, even when the number of arrangement positions of the alignment marks 14 is increased, since it is not necessary to form a dedicated region for arranging the alignment marks 14, it is possible to suppress an increase in a chip area and a scribe line area. Therefore, since it is not necessary to decrease the number of chips per wafer, the manufacturing cost can be reduced.

Moreover, similarly to the embodiment, in the case of such a stacked semiconductor substrate, it is possible to suppress an increase in a chip area and a scribe line area effectively.

In the embodiment and the respective modified examples, although a stacked semiconductor substrate obtained by stacking two semiconductor substrates and the image pickup element using the same have been described by way of example, the number of stacked semiconductor substrates is not limited to two layers but may be three layers or more. Moreover, similarly to the case of the second substrate 11 and the second wafer substrate 110, an alignment mark and a light-shielding layer portion may be formed in one semiconductor substrate.

In the method of bonding the first and second wafer substrates 120 and 110 according to the embodiment, although the alignment marks 14 of the first wafer substrate 120 are used for position detection, this is only an example, and the position detection can be realized without using the alignment marks 14.

For example, like the alignment marks 24 of the second wafer substrate 110, alignment marks may be formed at such positions that the alignment marks can be observed from the side of the wiring layer 12B close to the bonding electrodes 12a. In this case, the positions of the alignment marks are detected in a state in which the wiring layer 12B faces the incidence direction of the detection beam $L_D$ and the first wafer substrate is conveyed onto the second wafer substrate 110 in a state in which the positions are recorded to thereby realize alignment. By doing so, even when the photodetector forming layer 12A has a such a thickness that the photodetector forming layer does not transmit visible light, the visible light can be used as the detection beam $L_D$ without forming an opening in the photodetector forming layer 12A.

Moreover, an IR beam having excellent light-transmitting properties may be used as the detection beam $L_D$. In this case, when an IR beam is emitted from the lower side of the second wafer substrate 110, for example, the positions of the alignment marks that shield the IR beam can be detected even when the first and second wafer substrates 120 and 110 are superimposed. However, in this case, a light-shielding layer portion that shields the IR beam is not superimposed on the alignment marks used for superimposing the first and second wafer substrates 120 and 110.

While preferred embodiments of the present invention have been described and illustrated above, it should be understood that these embodiments are exemplary of the invention and are not to be considered as limiting. Additions, omissions, substitutions, and other modifications can be made without departing from the scope of the present invention. Accordingly, the present invention is not to be considered as being limited by the embodiments described above, and is only limited by the scope of the appended claims.

The respective embodiments (including modified examples) of the present invention can be broadly applied to a semiconductor substrate, an image pickup element, and an image pickup apparatus and can prevent a decrease in detection accuracy of alignment marks and suppress an increase in a chip area and a scribe line area.

What is claimed is:

1. A semiconductor substrate comprising:
   a first substrate including an alignment mark being formed of a material that reflects a detection light for detecting positions and having a detection edge portion, the detection light being incident on the first substrate from the outside;
   a second substrate being disposed to face the first substrate;
   a bonding layer portion that bonds the first and second substrates together,
   a light-shielding layer portion having a larger outer shape than the alignment mark, being formed of a material that shields the detection light, and being disposed at a position on a backside of the alignment mark when seen from an incidence side of the detection light; and
   one or more light-transmitting layer portions being laminated between the alignment mark and the light-shielding layer portion so as to transmit the detection light and not being patterned at least in a range that overlaps the light-shielding layer portion.

2. The semiconductor substrate according to claim 1, wherein a metal layer is formed in a region on a backside of the light-shielding layer portion when seen from the incidence side of the detection light.

3. The semiconductor substrate according to claim 2, wherein the alignment mark is formed of the metal layer.

4. The semiconductor substrate according to claim 2, wherein the light-shielding layer portion is formed of the metal layer.

5. The semiconductor substrate according to claim 1, wherein the light-transmitting layer portion and the light-shielding layer portion are provided in the first substrate.

6. The semiconductor substrate according to claim 1, wherein
   the light-shielding layer portion is provided in the bonding layer portion,
   a bonding electrode that electrically bonds the first and second substrates in the bonding layer portion is formed on an outer side of the light-shielding layer portion, and
   the light-transmitting layer portion is formed between the alignment mark of the first substrate and the light-shielding layer portion of the bonding layer portion.

7. The semiconductor substrate according to claim 1, wherein
   the light-shielding layer portion is provided in the second substrate,
   a bonding electrode that electrically bonds the first and second substrates in the bonding layer portion is formed on an outer side of a region that overlaps the light-shielding layer portion, and the light-transmitting layer portion is formed between the alignment mark of the first substrate and the light-shielding layer portion of the second substrate.

8. An image pickup element comprising the semiconductor substrate according to claim 1.

9. An image pickup apparatus comprising the image pickup element according to claim 8.

* * * * *